(12) United States Patent
Song et al.

(10) Patent No.: US 12,288,761 B2
(45) Date of Patent: Apr. 29, 2025

(54) SEMICONDUCTOR DEVICE INCLUDING RE-DISTRIBUTION PADS DISPOSED AT DIFFERENT LEVELS AND A METHOD OF MANUFACTURING THE SAME

(71) Applicant: SK hynix Inc., Icheon-si (KR)

(72) Inventors: Jun Yong Song, Icheon-si (KR); Kang Hun Kim, Icheon-si (KR); Si Yun Kim, Icheon-si (KR)

(73) Assignee: SK hynix Inc.

( * ) Notice: Subject to any disclaimer, the term of this patent is extended or adjusted under 35 U.S.C. 154(b) by 680 days.

(21) Appl. No.: 17/572,033

(22) Filed: Jan. 10, 2022

(65) Prior Publication Data

US 2023/0057560 A1    Feb. 23, 2023

(30) Foreign Application Priority Data

Aug. 20, 2021    (KR) .................. 10-2021-0110069

(51) Int. Cl.
     *H01L 23/48*      (2006.01)
     *H01L 23/00*      (2006.01)

(52) U.S. Cl.
     CPC .............. *H01L 24/06* (2013.01); *H01L 24/02* (2013.01); *H01L 24/03* (2013.01); *H01L 24/14* (2013.01); *H01L 24/49* (2013.01); *H01L 24/05* (2013.01); *H01L 24/13* (2013.01); *H01L 24/48* (2013.01); *H01L 2224/02313* (2013.01); *H01L 2224/02331* (2013.01); *H01L 2224/02381* (2013.01); *H01L 2224/0239* (2013.01); *H01L 2224/0346* (2013.01); *H01L 2224/03614* (2013.01); *H01L 2224/03914* (2013.01); *H01L 2224/05008* (2013.01); *H01L 2224/05073* (2013.01); *H01L 2224/05166* (2013.01); *H01L 2224/05548* (2013.01); *H01L 2224/05573* (2013.01); *H01L 2224/05639* (2013.01); *H01L 2224/05644* (2013.01); *H01L 2224/05647* (2013.01); *H01L 2224/06102* (2013.01); *H01L 2224/13111* (2013.01); *H01L 2224/13147* (2013.01);

(Continued)

(58) Field of Classification Search
CPC ... H01L 2224/02313–03914; H01L 24/02–06; H01L 24/48–49
See application file for complete search history.

(56) References Cited

U.S. PATENT DOCUMENTS

| 10,037,970 | B2 | 7/2018 | Clegg et al. | |
| 2009/0283898 | A1* | 11/2009 | Janzen | .......... H10D 84/01 257/E21.597 |

(Continued)

FOREIGN PATENT DOCUMENTS

KR      1020100020767 A      2/2010

*Primary Examiner* — Hoa B Trinh
(74) *Attorney, Agent, or Firm* — WILLIAM PARK & ASSOCIATES LTD.

(57) ABSTRACT

A semiconductor device includes a chip body; a passivation layer on the chip body; a lower dielectric layer on the passivation layer; a first re-distribution pad on the lower dielectric layer; an upper dielectric layer on the lower dielectric layer, the upper dielectric layer having a groove that exposes an upper surface of the first re-distribution pad; and a second re-distribution pad on the upper dielectric layer. An upper surface of the second re-distribution pad is positioned at a higher level than the upper surface of the first re-distribution pad.

20 Claims, 17 Drawing Sheets

(52) U.S. Cl.
CPC ................ *H01L 2224/1403* (2013.01); *H01L 2224/48227* (2013.01); *H01L 2224/49107* (2013.01)

(56) References Cited

U.S. PATENT DOCUMENTS

| | | | | |
|---|---|---|---|---|
| 2013/0168850 | A1* | 7/2013 | Samoilov | H01L 24/81 |
| | | | | 257/737 |
| 2013/0277838 | A1* | 10/2013 | Yu | H01L 24/02 |
| | | | | 257/737 |

* cited by examiner ations.

SEMICONDUCTOR DEVICE INCLUDING RE-DISTRIBUTION PADS DISPOSED AT DIFFERENT LEVELS AND A METHOD OF MANUFACTURING THE SAME

CROSS-REFERENCE TO RELATED APPLICATIONS

The present application claims priority of Korean Patent Application No. 10-2021-0110069, filed on Aug. 20, 2021, which is incorporated herein by reference in its entirety.

BACKGROUND

1. Field

Exemplary embodiments of the disclosure relate to a semiconductor device including re-distribution pads and a method of manufacturing the semiconductor device.

2. Description of the Related Art

As the size of semiconductor devices decreases, the number of bonding pads for electrical connection increases and gaps between the bonding pads decreases.

SUMMARY

In accordance with an embodiment of the disclosure, a semiconductor device includes a chip body; a passivation layer on the chip body; a lower dielectric layer on the passivation layer; a first re-distribution pad on the lower dielectric layer; an upper dielectric layer on the lower dielectric layer, the upper dielectric layer having a groove that exposes an upper surface of the first re-distribution pad; and a second re-distribution pad on the upper dielectric layer. An upper surface of the second re-distribution pad is positioned at a higher level than the upper surface of the first re-distribution pad.

In accordance an embodiment of the disclosure, a semiconductor device includes a chip body with a first metal pad and a second metal pad; a passivation layer on the chip body; a lower dielectric layer on the passivation layer; a first re-distribution pad on the lower dielectric layer; an upper dielectric layer on the lower dielectric layer, the upper dielectric layer having a groove that exposes an upper surface of the first re-distribution pad; and a second re-distribution pad on the upper dielectric layer. The first re-distribution pad includes a first via portion vertically penetrating the lower dielectric layer to be coupled with the first metal pad; and a first extended portion extending from the first via portion in a first horizontal direction. The second re-distribution layer includes a second via portion vertically penetrating the upper dielectric layer and the lower dielectric layer to be coupled with the second metal pad; and a second extended portion extending from the second via portion in the first horizontal direction.

In accordance with an embodiment of the disclosure, a semiconductor device includes: a lower dielectric layer disposed on the chip body; a plurality of first re-distribution pads disposed on the lower dielectric layer; an upper dielectric layer disposed on the lower dielectric layer, the upper dielectric layer having grooves that expose the first re-distribution pads; and a plurality of second re-distribution pads disposed on the upper dielectric layer. The first re-distribution pads and the second re-distribution pads extend in parallel in a first horizontal direction. The first re-distribution pads and the second re-distribution pads are alternately disposed in a second horizontal direction. The first horizontal direction and the second horizontal direction are perpendicular to each other.

In accordance with still another embodiment of the disclosure, a method of manufacturing a semiconductor device includes preparing a chip body with a first metal pad and a second metal pad; forming a passivation layer on the chip body; forming a lower dielectric layer on the passivation layer; forming a first re-distribution pad on the lower dielectric layer; forming an upper dielectric layer on the lower dielectric layer, the upper dielectric layer having a groove that exposes an upper surface of the first re-distribution pad; and forming a second re-distribution pad on the upper dielectric layer.

DETAILED DESCRIPTION

Exemplary embodiments of the disclosure will be described below in more detail with reference to the accompanying drawings. The disclosure may, however, be embodied in different forms and should not be construed as limited to the embodiments set forth herein. Rather, these embodiments are provided to make this disclosure thorough and complete, and fully convey the scope of the disclosure to those skilled in the art. The spirit and scope of the invention are as defined in the claims.

Embodiments of the disclosure provide semiconductor devices including re-distribution pads disposed at different levels.

Embodiments of the disclosure provide methods of manufacturing semiconductor devices including re-distribution pads disposed at different levels.

Figure 1A:
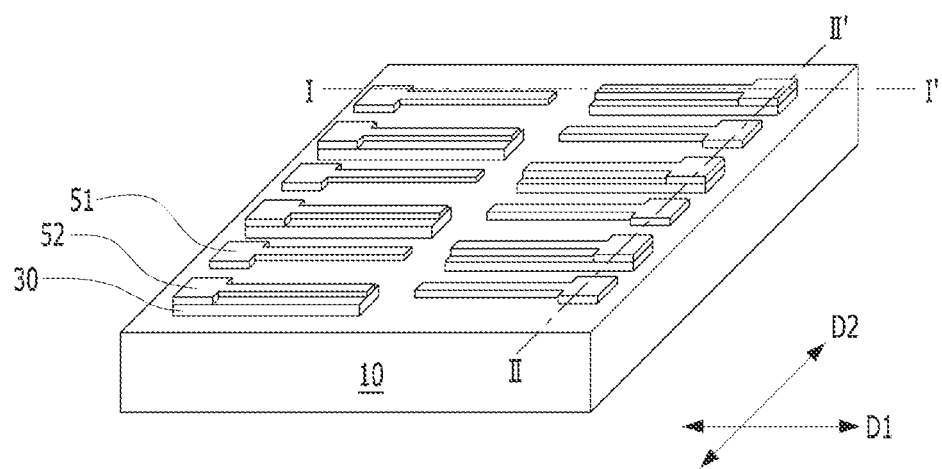
FIG. 1A is a perspective view illustrating a semiconductor device in accordance with an embodiment of the disclosure.

FIG. 1A is a perspective view illustrating a semiconductor device in accordance with an embodiment of the disclosure. Referring to FIG. 1A, the semiconductor device may include a plurality of lift-up layers 30, a plurality of first re-distribution pads 51, and a plurality of second re-distribution pads 52 that are disposed on a chip body 10. The lift-up layers 30 may include a dielectric material, and the first re-distribution pads 51 and the second re-distribution pads 52 may include a conductive material. The second re-distribution pads 52 may be disposed on the lift-up layers 30. Accordingly, the second re-distribution pads 52 may be disposed at a higher level than the first re-distribution pads 51. Each of the first re-distribution pads 51 and the second re-distribution pads 52 may extend from the center of the chip body 10 toward the edge in a first horizontal direction D1, The first re-distribution pads 51 and the second re-distribution pads 52 may be alternately disposed to be adjacent to each other in a second horizontal direction D2. The first horizontal direction D1 and the second horizontal direction D2 may be perpendicular to each other.

Figure 1B:
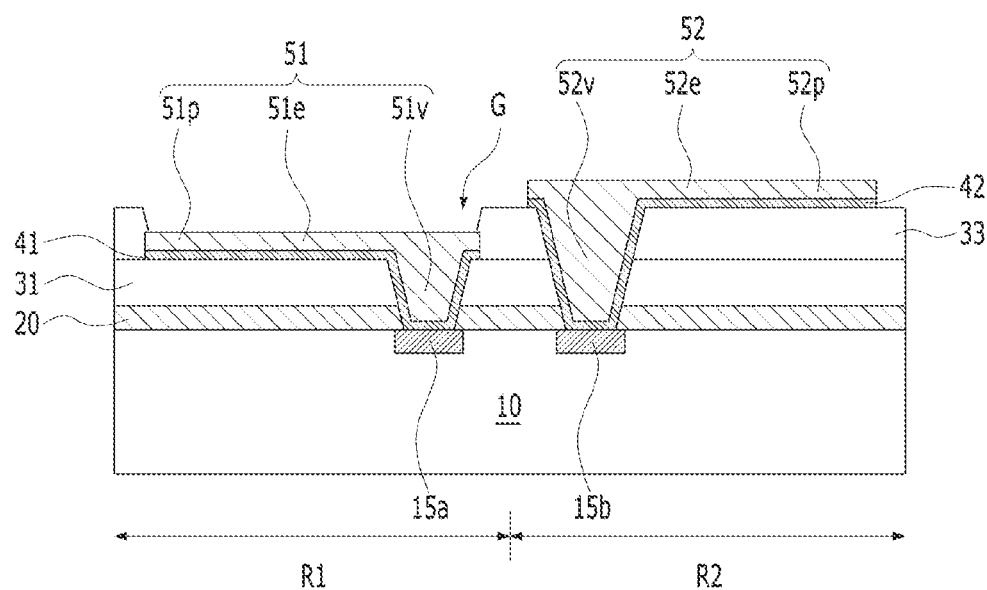
FIG. 1B is a longitudinal cross-sectional view of the semiconductor device, taken along a line I-I', shown in FIG. 1A.
Figure 1C:
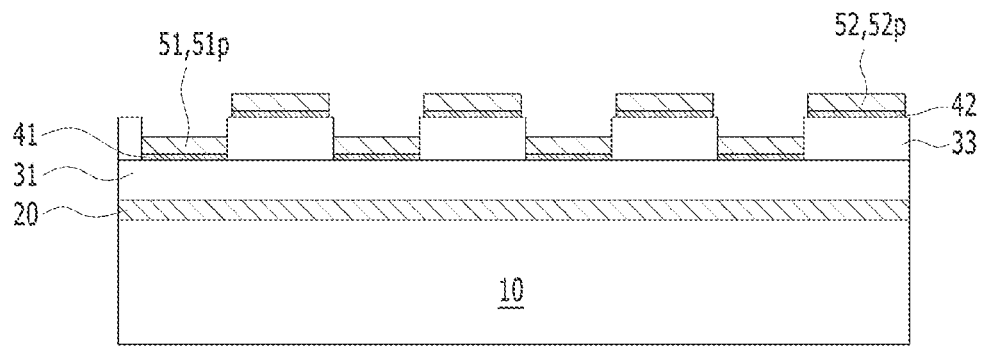
FIG. 1C is a longitudinal cross-sectional view of the semiconductor device, taken along a line II-II', shown in FIG. 1A.

FIG. 1B is a longitudinal cross-sectional view of the semiconductor device, taken along a line I-I', shown in FIG. 1A. FIG. 1C is a longitudinal cross-sectional view of the semiconductor device, taken along a line shown in FIG. 1A. Referring to FIGS. 1B and 1C, the semiconductor device according to the exemplary embodiment of the present disclosure may include a chip body 10, a first re-distribution pad 51 that is disposed in a first region R1, and a second re-distribution pad 52 that is disposed in a second region R2. The chip body 10 may include a silicon substrate, transistors on the silicon substrate, a metal interconnection layers, and interlayer dielectric layers. The chip body 10 may include a first metal pad 15a in the first region R1 and a second metal pad 15b in the second region R2. The first metal pad 15a and the second metal pad 15b may be disposed near the center of the chip body 10, The first metal pad 15a and the second metal pad 15b may correspond to a top metal interconnection layer, among the metal interconnection layers in the chip body 10. For example, the first metal pad 15a and the second metal pad 15b may include input/output pads. The first metal pad 15a and the second metal pad 15b may include at least one among metals, such as aluminum (Al), nickel (Ni), copper (Cu) or tungsten (W), metal alloys such as titanium aluminum (TiAl), or metal compounds such as titanium nitride (TiN). The first re-distribution pad 51 and the second re-distribution pad 52 may include a metal with high conductivity, such as gold (Au), silver (Ag), or copper (Cu).

The semiconductor device may further include a passivation layer 20 that is formed on the chip body 10, a lower dielectric layer 31 that is formed on the passivation layer 20, and an upper dielectric layer 33 that is formed on the lower dielectric layer 31. The passivation layer 20 may expose an upper surface of the first metal pad 15a and an upper surface of the second metal pad 15b. The upper dielectric layer 33 may correspond to the lift-up layer 30 of FIG. 1. Each of the passivation layer 20, the lower dielectric layer 31, and the upper dielectric layer 33 may include at least one of inorganic materials, such as silicon oxide ($SiO_2$), silicon nitride (SiN), silicon oxynitride (SiON) and aluminum oxide ($Al_2O_3$), and organic materials such as polyimide (PI), polybenzoxazole (PBO), benzocyclobutene (BCB), polyethylene naphthalate (PEN), polyethylene terephthalate (PET), and polyether ether ketone (PEEK).

The first re-distribution pad 51 may include a first via portion 51v that vertically penetrates the lower dielectric layer 31 to be coupled with the first metal pad 15a, a first extended portion 51e that is disposed on the lower dielectric layer 31 to horizontally extend from the first via portion 51v, and a first pad portion 51p that corresponds to an end portion of the first extended portion 51e. Upper surfaces of the first via portion 51v, the first extended portion 51e, and the first pad portion 51p may be coplanar. For example, the first via portion 51v may be disposed near the center of the chip body 10, and the first pad portion 51p may be disposed near the edge of the chip body 10, The second re-distribution pad 52 may include a second via portion 52v that vertically penetrates the upper dielectric layer 33 and the lower dielectric layer 31 to be coupled with the second metal pad 15b, a second extended portion 52e that is disposed on the upper dielectric layer 33 to horizontally extend from the second via portion 52v, and a second pad portion 52p that corresponds to an end portion of the second extended portion 52e. Upper surfaces of the second via portion 52v, the second extended portion 52e, and the second pad portion 52p may be coplanar. For example, the second via portion 52v may be disposed near the center of the chip body 10, and the second pad portion 52p may be disposed near the edge of the chip body 10.

The first extended portion 51e and the first pad portion 51p of the first re-distribution pad 51 may be disposed on the lower dielectric layer 31. The lower dielectric layer 31 may surround lower portions of all side surfaces of the first via portion 51v of the first re-distribution pad 51 and a lower portion of the side surface of the second via portion 52v of the second re-distribution pad 52. The upper dielectric layer 33 may cover the side surfaces of the first re-distribution pad 51. For example, the upper dielectric layer 33 may be in contact with the side surfaces of the first pad portion 51p and the first extended portion 51e of the first re-distribution pad 51. The upper dielectric layer 33 may be in contact with an upper portion the side surface of the first via portion 51v of the first re-distribution pad 51. The upper dielectric layer 33 may have a groove G that exposes the upper surface of the first re-distribution pad 51. The upper dielectric layer 33 may surround an upper portion of the side surfaces of the second via portion 52v of the second re-distribution pad 52. The second extended portion 52e and the second pad portion 52p of the second re-distribution pad 52 may be disposed on the upper dielectric layer 33. Accordingly, the second extended portion 52e and the second pad portion 52p of the second re-distribution pad 52 may be positioned at a higher level than the first extended portion 51e and the first pad portion 51p of the first re-distribution pad 51. The upper surface of the second re-distribution pad 52 may be positioned at a higher level than the upper surface of the first re-distribution pad 51. The second via portion 52v of the second re-distribution pad 52 may be greater (taller or longer) than the first via portion 51v of the first re-distribution pad 51.

A lower metal liner 41 may be conformally formed on the lower surface of the first re-distribution pad 51, and an upper metal liner 42 may be conformally formed on the lower surface of the second re-distribution pad 52. The lower metal liner 41 and the upper metal liner 42 may include a single metal layer or multiple metal layers. For example, the lower metal liner 41 and the upper metal liner 42 may include a Ti layer and a Malloy layer. The lower metal liner 41 and the upper metal liner 42 may be used as a barrier metal layer and a seed metal layer.

Figure 2A:
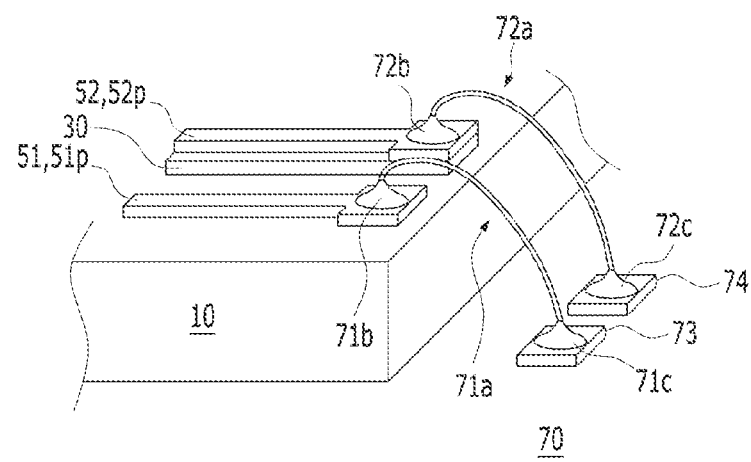
FIG. 2A is a schematic perspective view illustrating a semiconductor device wire-bonded on a circuit board.
Figure 2B:
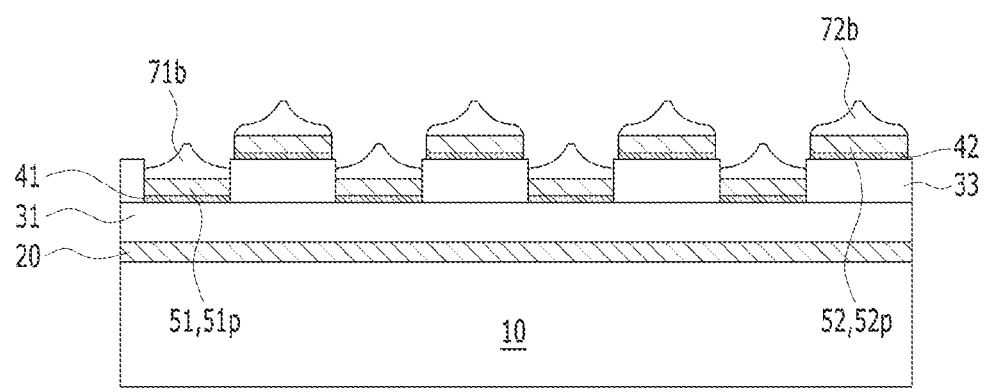
FIG. 2B is a side view illustrating re-distribution pads on which chip wire bases are formed.

FIG. 2A is a schematic perspective view illustrating a semiconductor device that is wire-bonded on a circuit board 70. FIG. 2B is a side view illustrating re-distribution pads 51 and 52 on which chip wire bases 71b and 72b are formed. Referring to FIG. 2A, the semiconductor device in accordance with an embodiment of the present disclosure may be electrically and physically bonded to the circuit board 70 by using a first wire 71a and a second wire 72a. A first substrate bonding pad 73 and a second substrate bonding pad 74 may be disposed on the circuit board 70. A first substrate wire base 71c may be formed on the first substrate bonding pad 73, and a second substrate wire base 72c may be formed on the second substrate bonding pad 74. A first chip wire base 71b may be formed on the first pad portion 51p of the first re-distribution pad 51, and a second chip wire base 72b may be formed on the second pad portion 52p of the second re-distribution pad 52. The first wire 71a may couple the first substrate wire base 71c to the first chip wire base 71b. The second wire 72a may couple the second substrate wire base 72c to the second chip wire base 72b. The wire bases 71b, 71c, 72b, and 72c may be the result of melting a wire material. The wire bases 71b, 71c, 72b, and 72c may make the pads 51, 52, 73, and 74 and the wires 71a and 72a to have low electrical resistance and to be bonded to each other stably. The wire bases 71b, 71c, 72b, and 72c may have a hemi-spherical shape. For stable connection, it may be desirable that the wire bases 71b, 71c, 72b, and 72c have sufficient volume, and it may be also desirable that the wire bases 71b, 71c, 72b, and 72c are spaced apart from the neighboring first and second re-distribution pads 51 and 52 and the neighboring first and second chip wire bases 71b and 72b so as not to be electrically shorted and not to cause electrical interference.

Figure 3A:
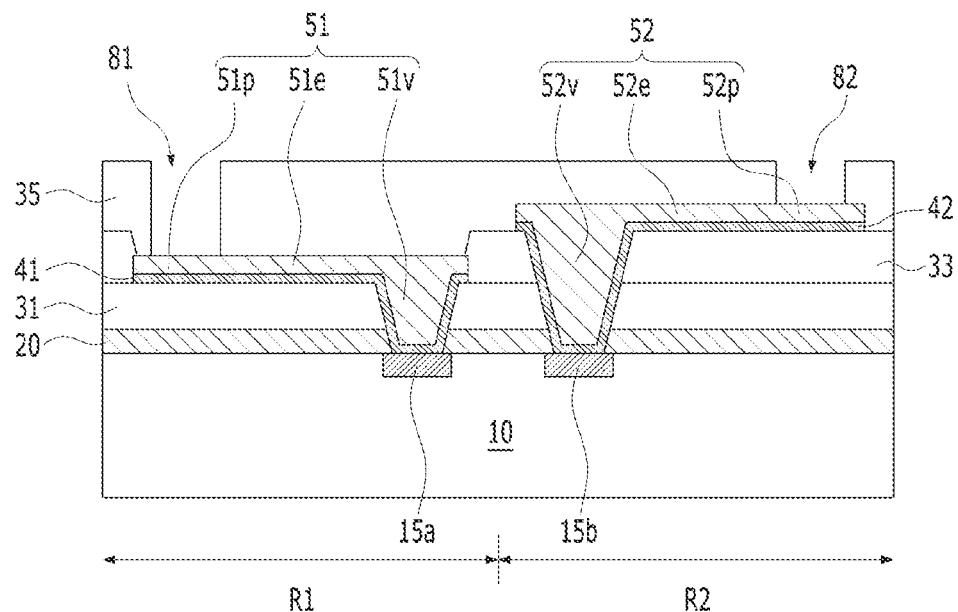
FIG. 3A is a longitudinal cross-sectional view of a semiconductor device in accordance with an embodiment of the disclosure taken, along the line I-I', shown in FIG. 1A.

FIG. 3A is a longitudinal cross-sectional view of a semiconductor device in accordance with an embodiment of the disclosure, taken along the line I-I', shown in FIG. 1A. Referring to FIG. 3A, the semiconductor device may further include a protective dielectric layer 35 with a first connection hole 81 and a second connection hole 82 as compared with the semiconductor device illustrated in FIG. 1. The first connection hole 81 may expose the first pad portion 51p of the first re-distribution pad 51. The second connection hole 82 may expose the second pad portion 52p of the second re-distribution pad 52. The protective dielectric layer 35 may include one of the materials that may form the upper dielectric layer 33. The first connection holes 81 and the second connection holes 82 may confine the first chip wire base 71b and the second chip wire base 72b, shown in FIGS. 2A and 2B. Therefore, electrical short and interference between the first chip wire base 71b and the second chip wire base 72b may be prevented.

Figure 3B:
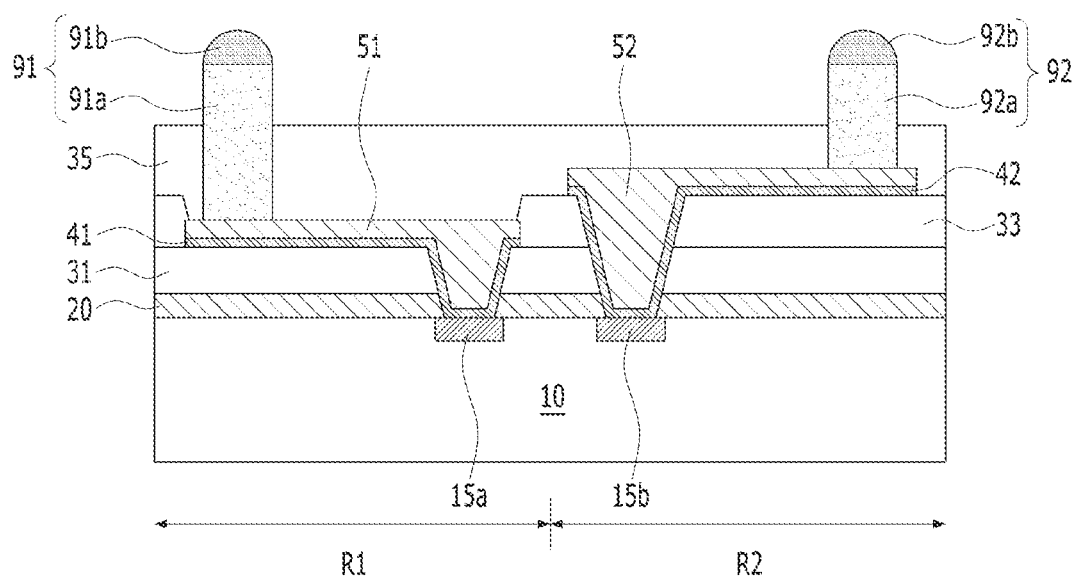
FIG. 3B is a longitudinal cross-sectional view of the semiconductor device in accordance with the embodiment of the disclosure, taken along the line I-I', shown in FIG. 1A.

FIG. 3B is a longitudinal cross-sectional view of the semiconductor device in accordance with the embodiment of the disclosure, taken along the line I-I', shown in FIG. 1A. Referring to FIG. 3B, the semiconductor device may further include a first pillar 91 and a second pillar 92 as compared to the semiconductor device, illustrated in FIG. 3A. The first pillar 91 may include a first post 91a and a first bonding portion 91b, and the second pillar 92 may include a second post 92a and a second bonding portion 92b, The first post 91a may be formed in the first connection hole 81 to be coupled to the first re-distribution pad 51, and the second post 92a may be formed in the second connection hole 82 to be coupled to the second re-distribution pad 52. The upper end of the first pillar 91 and the upper end of the second pillar 92 may be positioned at the same level. For example, the first pillar 91 may be greater (taller or longer) than the second pillar 92. The first bonding portion 91b may be formed on the first post 91a to provide chemical stability and physical bonding stability, and the second bonding portion 92b may be formed on the second post 92a to provide chemical stability and physical bonding stability. The first pillar 91 and the second pillar 92 may provide a structure for flip chip bonding. The first post 91a and the second post 92a may include a metal such as copper (Cu). The first bonding portion 91b and the second bonding portion 92b may include a solder material, such as tin (Sn).

Figure 4A:
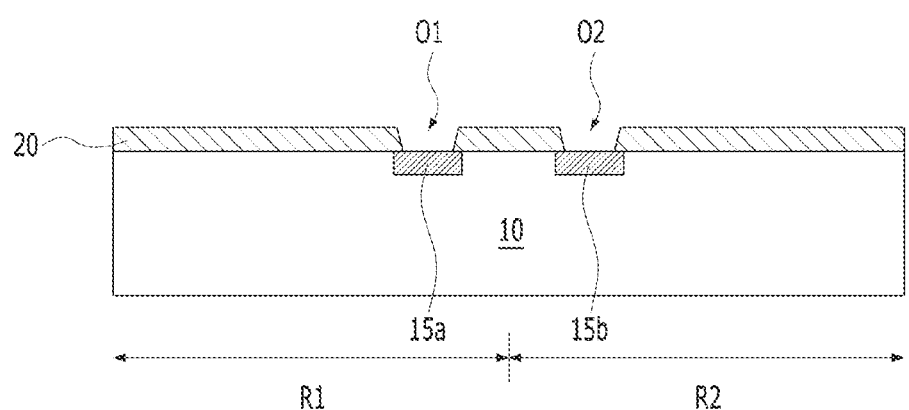
FIGS. 4A to 4L, 5A to 5H, and 6A to 6F are longitudinal cross-sectional views illustrating methods of manufacturing semiconductor devices in accordance with diverse embodiments of the disclosure.

FIGS. 4A to 4L are longitudinal cross-sectional views illustrating a method of fabricating a semiconductor device in accordance with an embodiment of the disclosure. Referring to FIG. 4A, the method of fabricating a semiconductor device may include providing a chip body 10 with a first metal pad 15a that is formed in a first region R1 and a second metal pad 15b that is formed in a second region R2, and forming a passivation layer 20 with a first opening O1 and a second opening O2 on the upper surface of the chip body 10 in which the first metal pad 15a and the second metal pad 15b are formed. Forming the passivation layer 20 may include performing a deposition process or a coating process to form an inorganic dielectric material or a polymer organic dielectric material. Forming the first opening O1 and the second opening O2 may include performing a photolithography process to selectively remove the passivation layer 20 to expose the first metal pad 15a the second metal pad 15b.

Figure 4B:
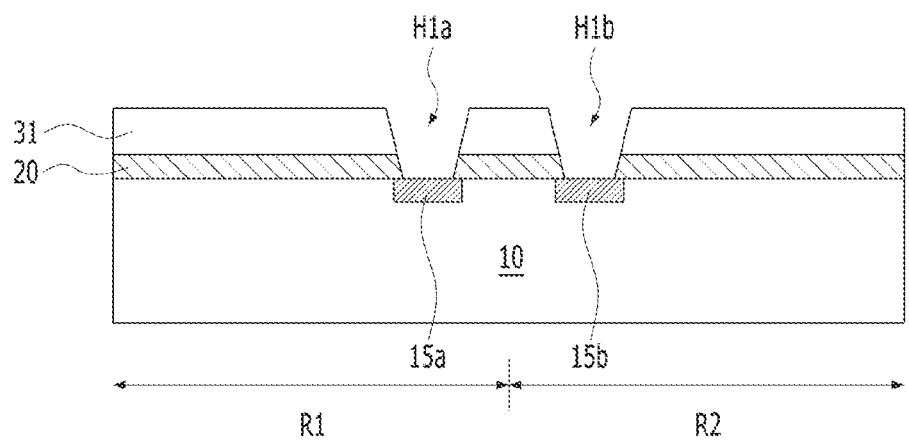

Referring to FIG. 4B, the method may further include forming a lower dielectric layer 31 with a first lower hole H1a and a second lower hole H1b on the passivation layer 20, Forming the lower dielectric layer 31 may include performing a deposition process or a coating process to form an inorganic dielectric material layer or an organic dielectric material layer and performing a patterning process to form the first lower hole H1a and the second lower hole H1b that expose the first metal pad 15a and the second metal pad 15b, respectively. The first lower hole H1a may overlap with the first opening O1 and expose the first metal pad 15a. The second lower hole H1b may overlap with the second opening O2 and expose the second metal pad 15b.

Figure 4C:
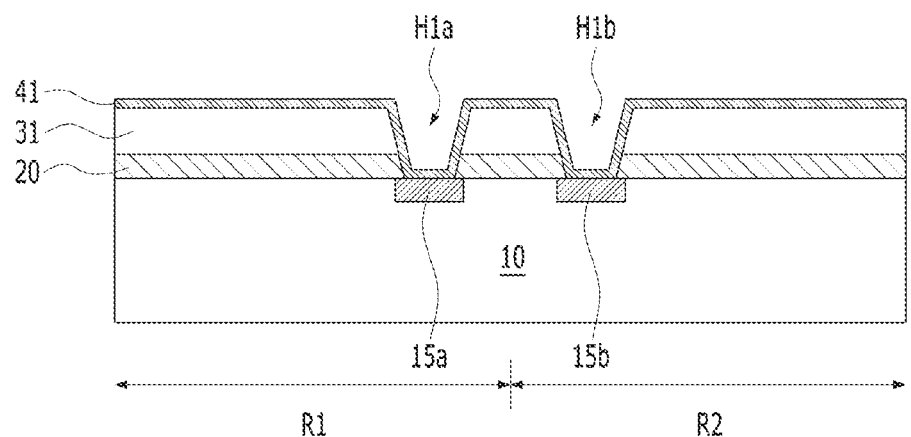

Referring to FIG. 4C, the method may further include forming a lower metal liner 41, Forming the lower metal liner 41 may include forming a metal layer including titanium (Ti) by performing a Physical Vapor Deposition (PVD) process, such as sputtering. The lower metal liner 41 may be conformally formed on the upper surfaces of the first and second metal pads 15a and 15b, the sidewalls of the first and second lower holes H1a and H1b, and the upper surface of the lower dielectric layer 31. The side surfaces of the passivation layer 20 and the lower dielectric layer 31 may be exposed in the first lower hole H1a and the second lower hole Nib. Forming the lower metal liner 41 may include forming a Ti layer and forming a TiW layer on the Ti layer.

Figure 4D:
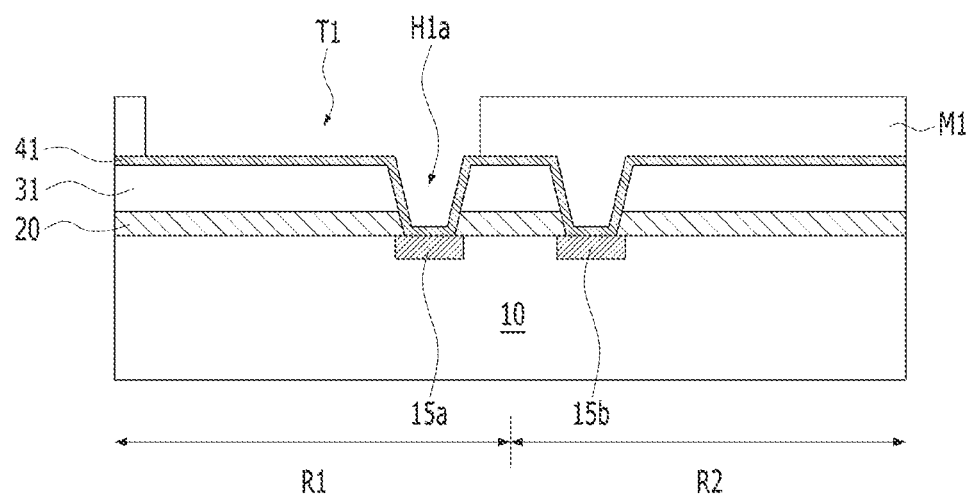

Referring to FIG. 4D, the method may further include forming a first mask pattern M1 with a first trench T1. The first trench T1 may expose the lower metal liner 41 in the first region R1, Forming the first mask pattern M1 may include entirely coating an organic material, such as photoresist, and performing a photolithography process to form the first trench T1.

Figure 4E:
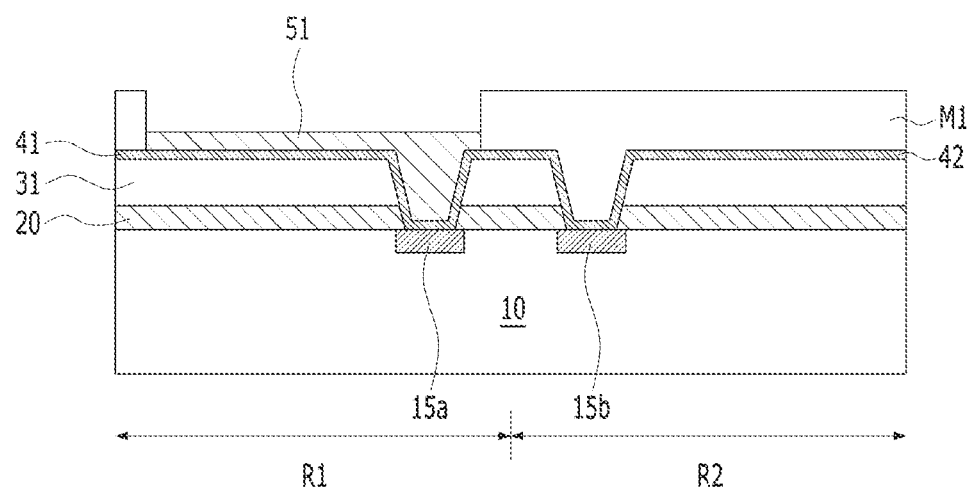

Referring to FIG. 4E, the method may further include forming the first re-distribution pad 51 in the first trench T1. Forming the first re-distribution pad 51 may include performing a plating process. The first re-distribution pad 51 may include a metal, such as gold (Au), silver (Ag), or copper (Cu).

Figure 4F:
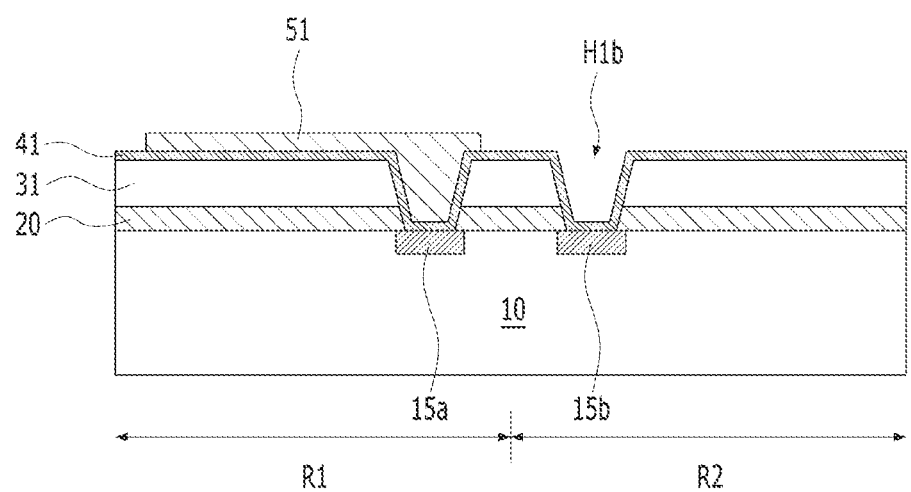

Referring to FIG. 4F, the method may further include removing the first mask pattern M1. Removing the first mask pattern M1 may include performing an aching process by using oxygen plasma. The first mask pattern M1 may be removed to expose the lower metal liner 41.

Figure 4G:
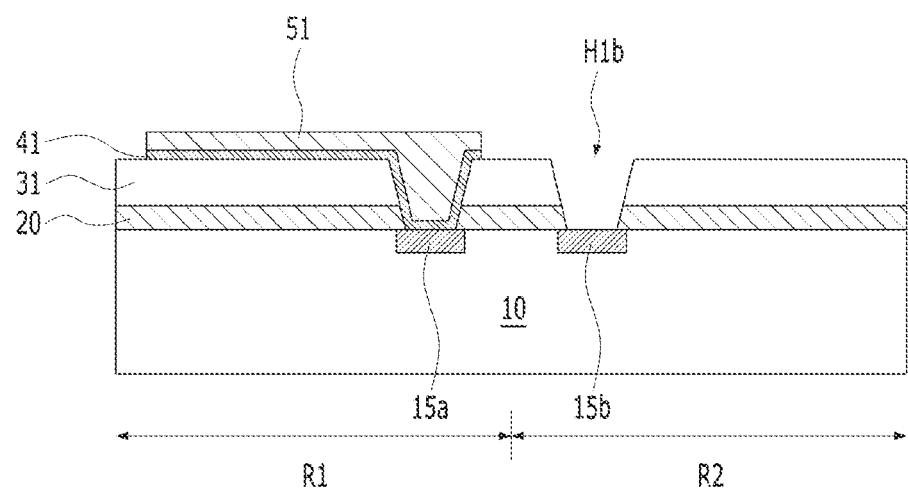

Referring to FIG. 4G, the method may further include removing the exposed lower metal liner 41. The lower metal liner 41 may remain only in the lower portion of the first re-distribution pad 51, Removing the lower metal liner 41 may include performing a wet etching process or a wet cleaning process.

Figure 4H:
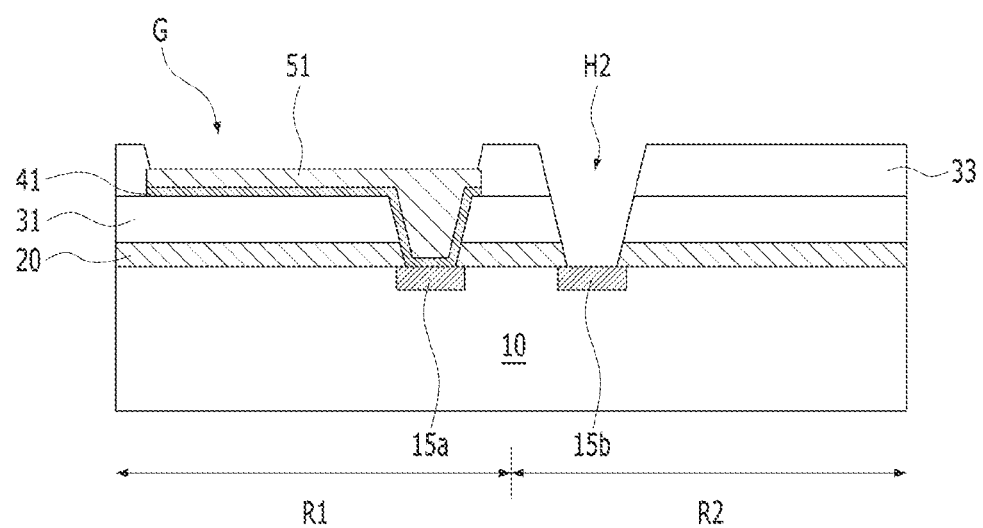

Referring to FIG. 4H, the method may further include forming the upper dielectric layer 33 with a groove G and an upper hole H2. Forming the upper dielectric layer 33 may include performing a deposition process or a coating process to form an inorganic dielectric material layer or an organic dielectric material layer and performing a patterning process to form the groove G and the upper hole H2, The groove G may expose the first re-distribution pad 51. The upper hole H2 may overlap with the second lower hole H1b to expose a surface of the second metal pad 15b.

Figure 4I:
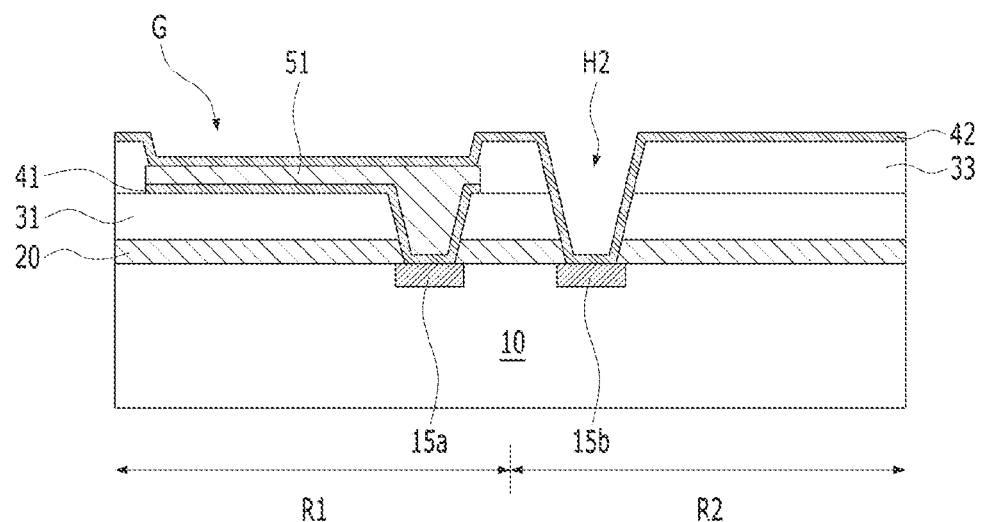

Referring to FIG. 4I, the method may further include forming the upper metal liner 42 on the entire surface. The process of forming the upper metal liner 42 may be the same as the process of forming the lower metal liner 41. The upper metal liner 42 may be conformally formed on the upper surface of the first re-distribution pad 51 that is exposed in the groove G, the side surfaces of the groove G, the upper surface of the second metal pad 15b, the sidewalls of the first lower hole H1b and the upper hole H2, and the upper surface of the upper dielectric layer 33. The side surfaces of the passivation layer 20, the lower dielectric layer 31, and the upper dielectric layer 33 may be exposed in the second lower hole Hib and the upper hole H2.

Figure 4J:
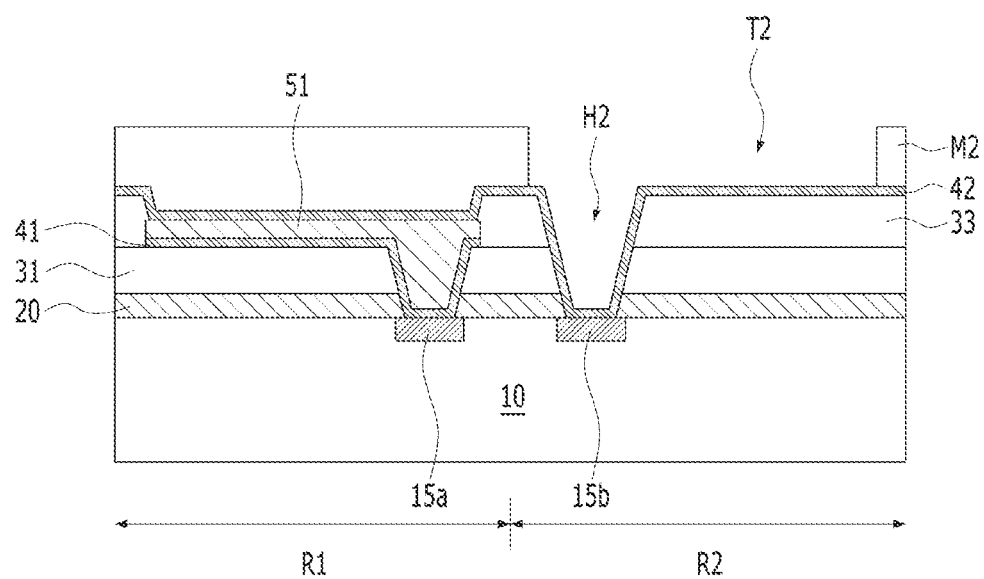

Referring to FIG. 4J, the method may further include forming a second mask pattern M2 with a second trench T2. The second trench T2 may expose the upper metal liner 42 in the second region R2. Forming the second mask pattern M2 may include coating the organic material, such as photoresist, on the entire upper metal liner 42 and performing a photolithography process to form the second trench T2. The second mask pattern M2 may fill the groove G. The second lower hole H1b and the upper hole H2 may be exposed in the second trench T2.

Figure 4K:
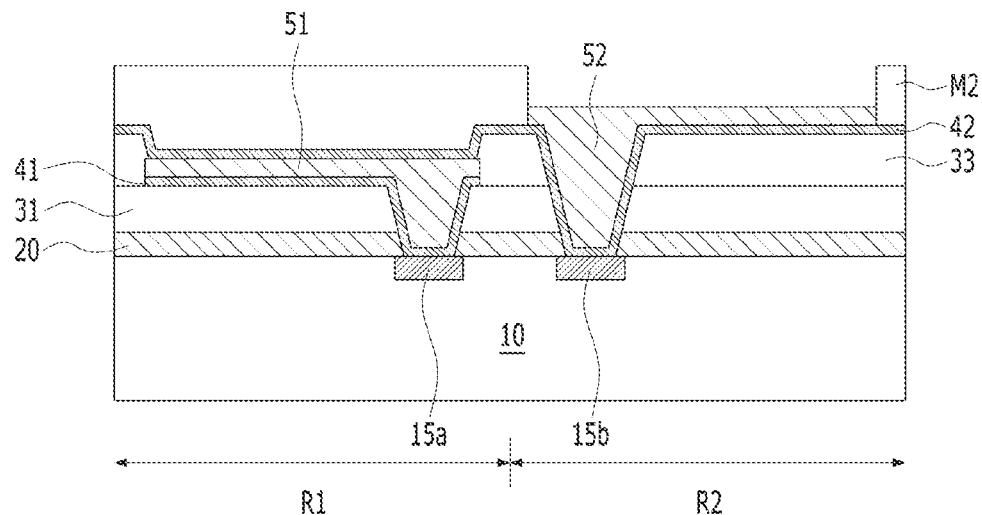

Referring to FIG. 4K, the method may further include forming a second re-distribution pad 52 in the upper hole H2, the second lower hole H1b and the second trench T2. Forming the second re-distribution pad 52 may include performing a plating process. The second re-distribution pad 52 may include a metal, such as gold (Au), silver (Ag), or copper (Cu).

Figure 4L:
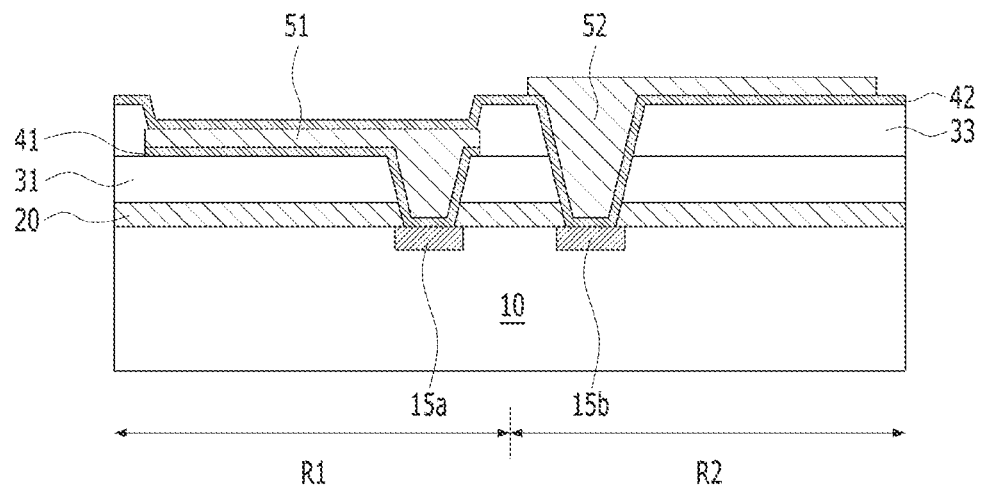

Referring to FIG. 4L, the method may further include removing the second mask pattern M2. The upper metal liner 42 may be exposed.

Subsequently, referring to FIG. 1B, the method may further include removing the exposed upper metal liner 42. The upper metal liner 42 may remain only in the lower portion of the second re-distribution pad 52.

Figure 5A:
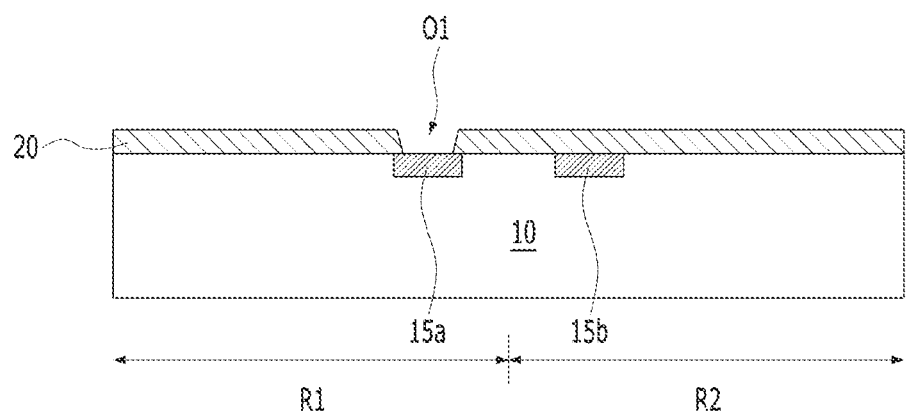

FIGS. 5A to 5H are longitudinal cross-sectional views illustrating a method of manufacturing a semiconductor device in accordance with an embodiment of the disclosure, Referring to FIG. 5A, the method of manufacturing a semiconductor device may include preparing a chip body 10 with a first metal pad 15a that is formed in a first region R1 and a second metal pad 15b that is formed in a second region R2, and forming a passivation layer 20 with a first opening O1 that exposes an upper surface of the first metal pad 15a on an upper surface of the chip body 10 in which the first metal pad 15a and the second metal pad 15b are formed. Compared with FIG. 4A, the second opening O2 might not be formed.

Figure 5B:
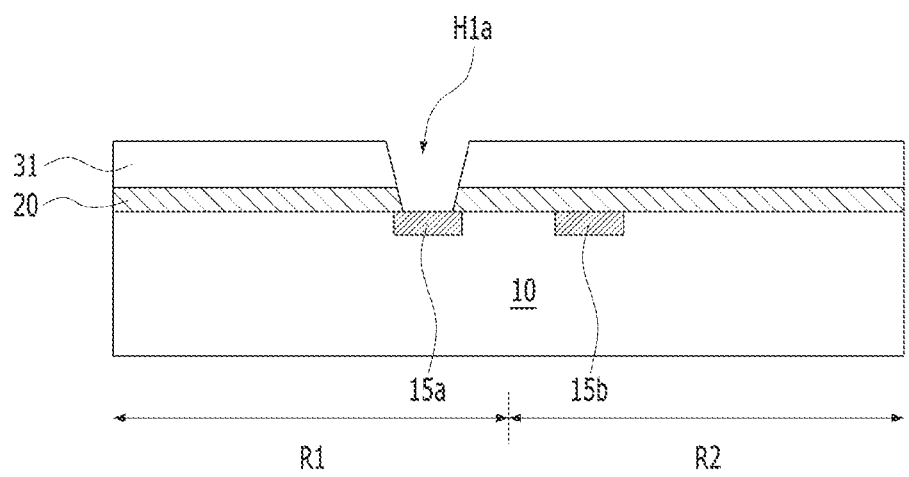

Referring to FIG. 5B, the method may further include forming a lower dielectric layer 31 with a first lower hole H1a on the passivation layer 20. Compared with FIG. 4B, the second lower hole H1b might not be formed.

Figure 5C:
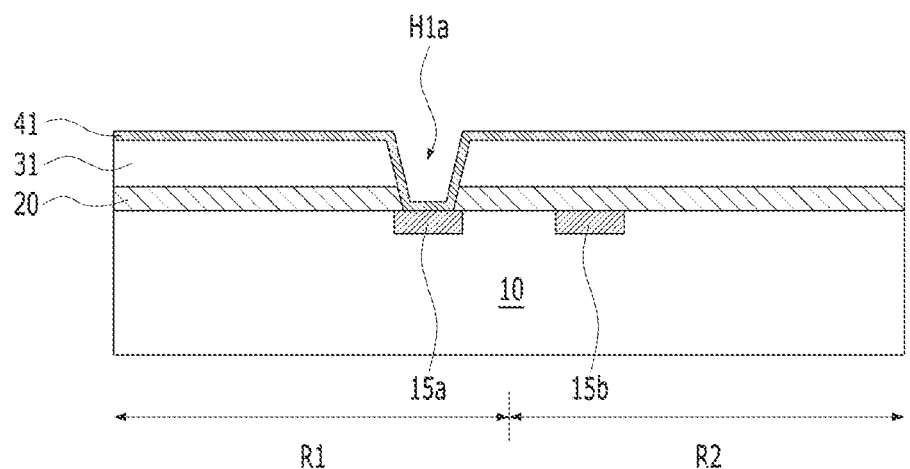

Referring to FIG. 5C, the method may include conformally forming a lower metal liner 41 on the upper surface of the first metal pad 15a, a sidewall of the first lower hole H1a, and an upper surface of the lower dielectric layer 31.

Figure 5D:
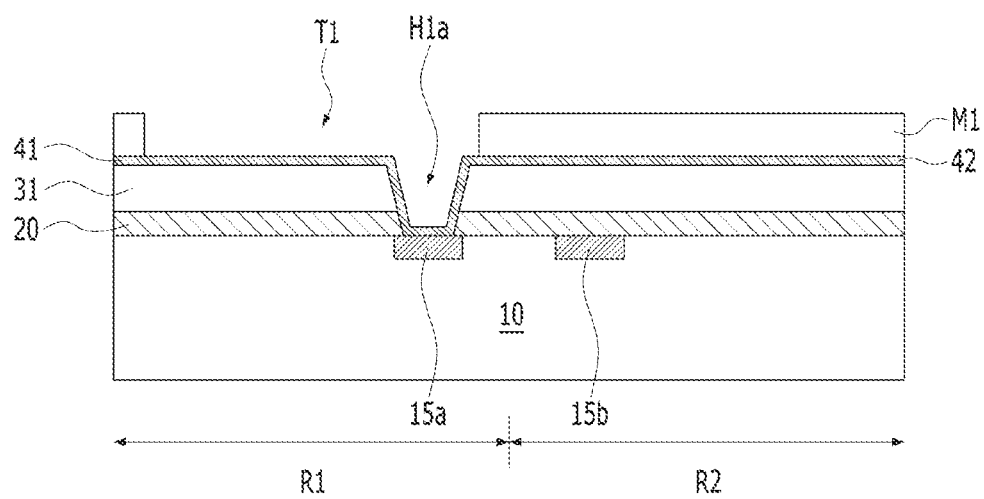

Referring to FIG. 5D, the method may further include forming a first mask pattern M1 with a first trench T1, The first trench T1 may expose the lower metal liner 41 in the first region R1.

Figure 5E:
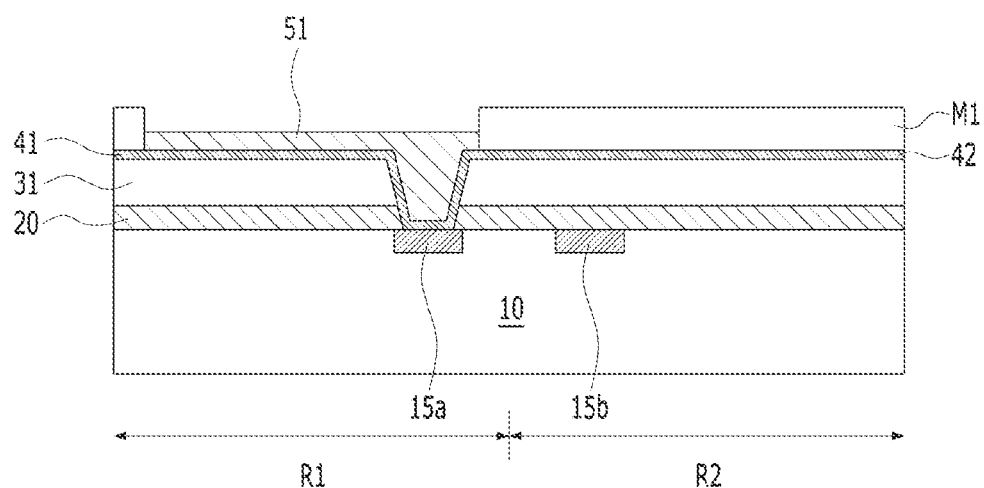

Referring to FIG. 5E, the method may further include forming a first re-distribution pad 51 in the first trench T1.

Figure 5F:
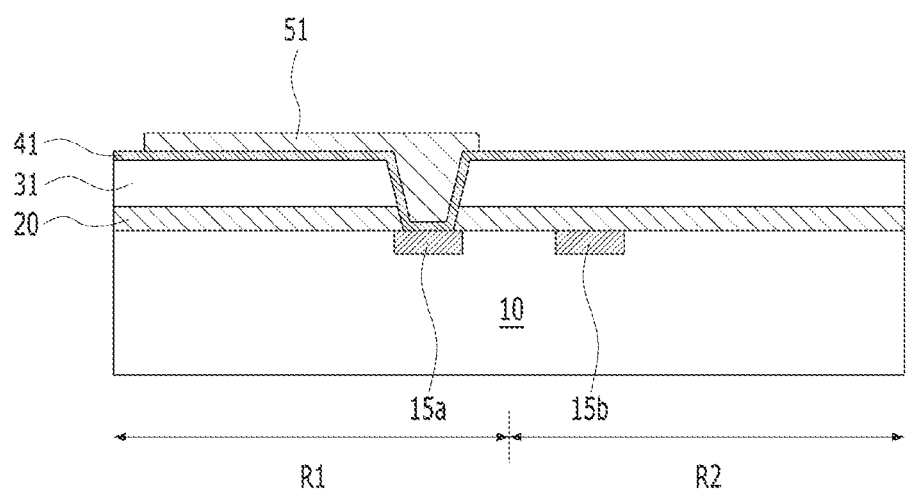

Referring to FIG. 5F, the method may further include removing the first mask pattern M1. The first mask pattern M1 may be removed to expose the lower metal liner 41.

Figure 5G:
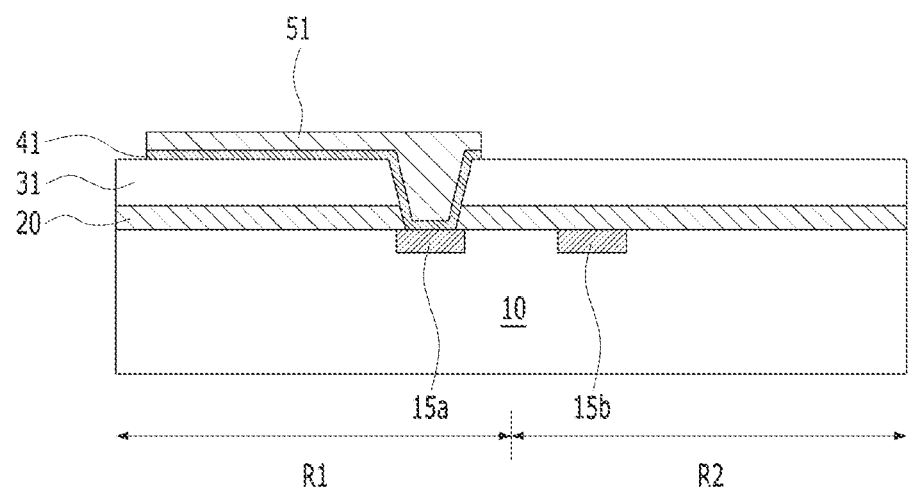

Referring to FIG. 5G, the method may further include removing the exposed lower metal liner 41 to form the first re-distribution pad 51.

Figure 5H:
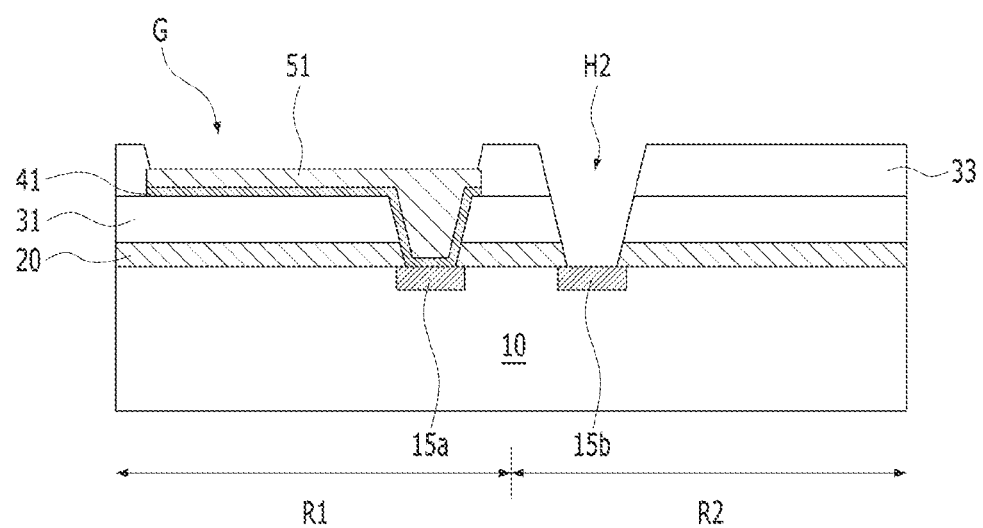

Referring to FIG. 5H, the method may include forming an upper dielectric layer with an upper hole H2 and a groove G. The upper hole H2 may expose an upper surface of the second metal pad 15b, and the groove G may expose an upper surface of the first re-distribution pad 51.

Subsequently, the method may further include performing the processes, described with reference to FIGS. 4I to 4L, to form the semiconductor device, illustrated in FIGS. 1A to 1C.

Figure 6A:
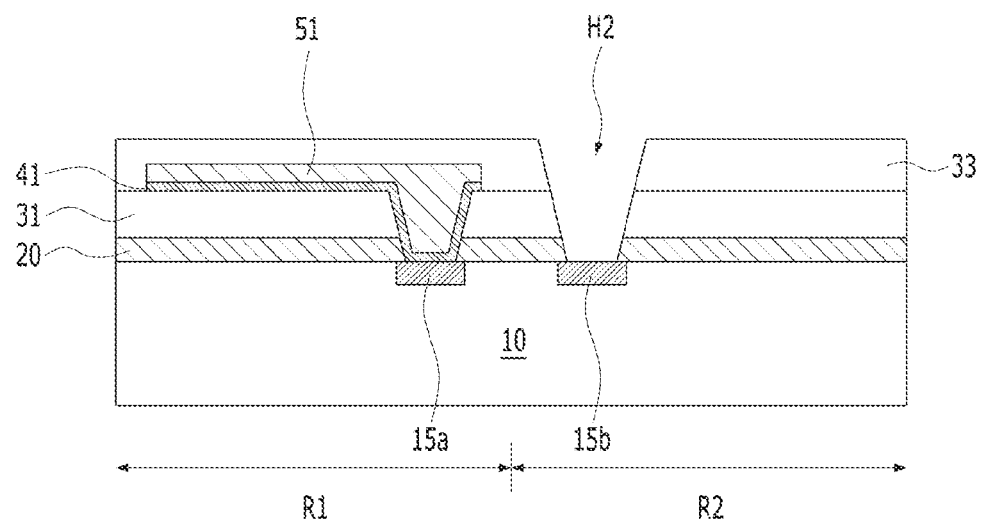

FIGS. 6A to 6F are longitudinal cross-sectional views illustrating a method of manufacturing a semiconductor device in accordance with an embodiment of the disclosure. Referring to FIG. 6A, the method of manufacturing a semiconductor device may include performing the processes, described with reference to FIGS. 5A to 5G, and forming an upper dielectric layer 33 with an upper hole H2 on a first re-distribution pad 51 and a lower dielectric layer 31. Compared with FIG. 5H, the groove G might not be formed.

Figure 6B:
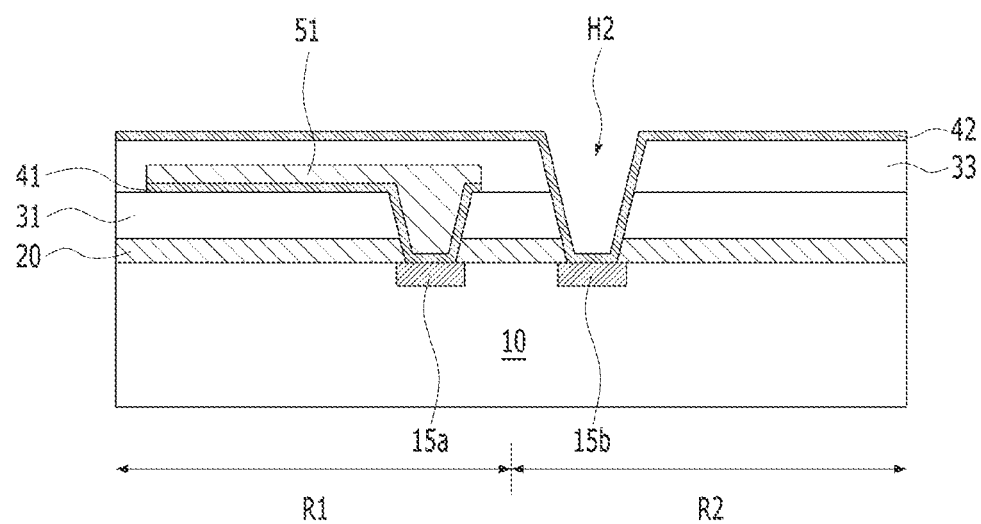

Referring to FIG. 6B, the method may further include conformally forming an upper metal liner 42 on an upper surface of the second metal pad 15b, an inner wall of the upper hole H2, and the upper surface of the upper dielectric layer 33.

Figure 6C:
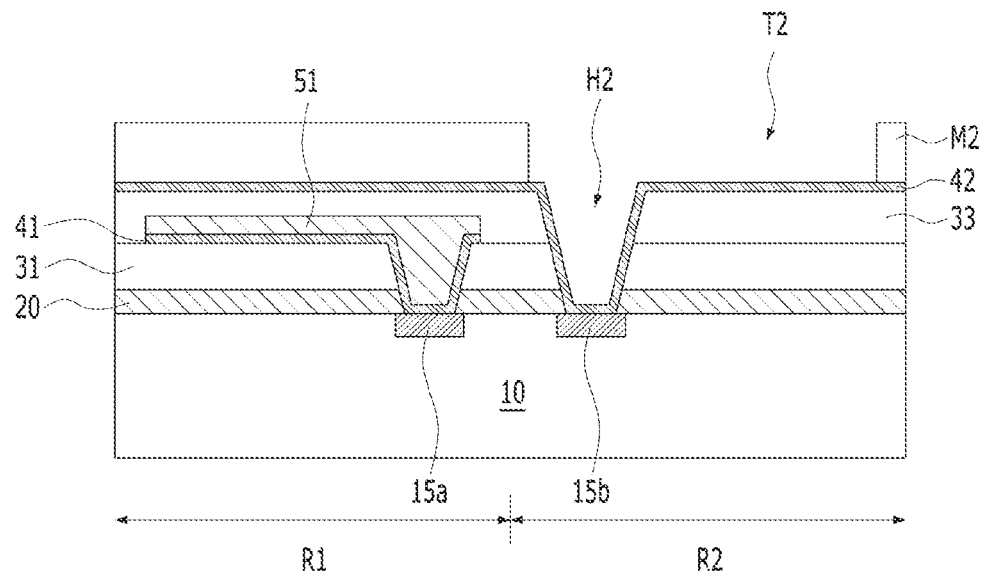

Referring to FIG. 6C, the method may further include forming a second mask pattern M2 with a second trench T2. The second trench T2 may expose the upper metal liner 42 in the second region R2. The upper hole H2 may be exposed in the second trench T2.

Figure 6D:
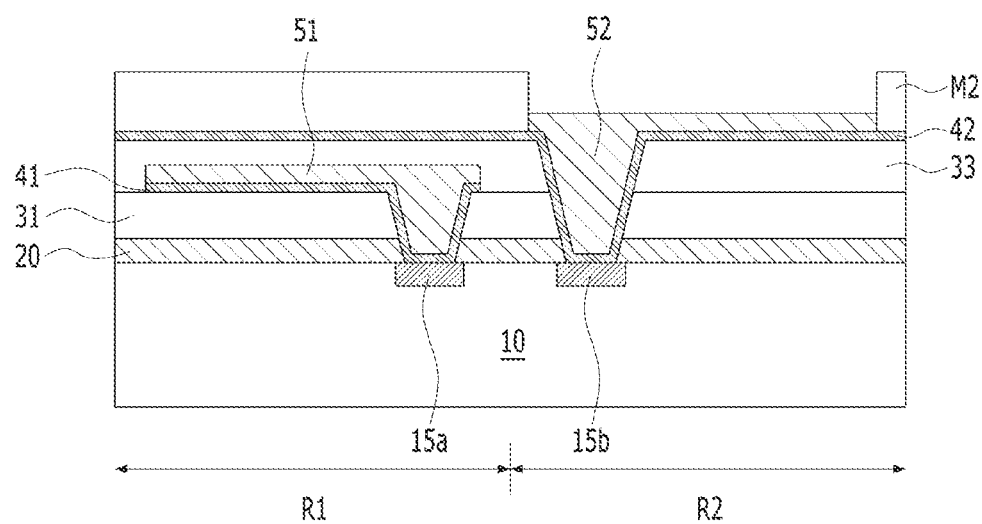

Referring to FIG. 6D, the method may further include forming a second re-distribution pad 52 in the upper hole H2 and the second trench T2.

Figure 6E:
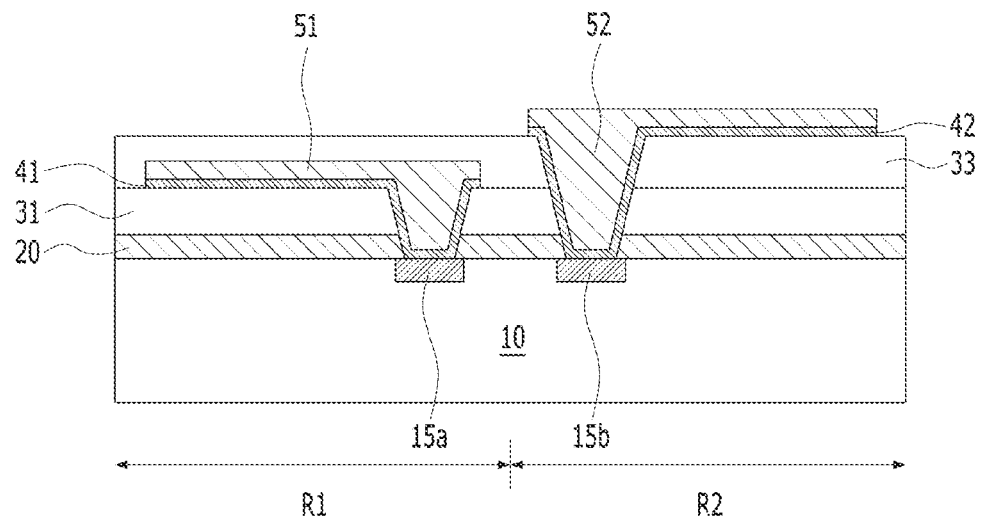

Referring to FIG. 6E, the method may further include removing the second mask pattern M2 and removing the exposed upper metal liner 42.

Figure 6F:
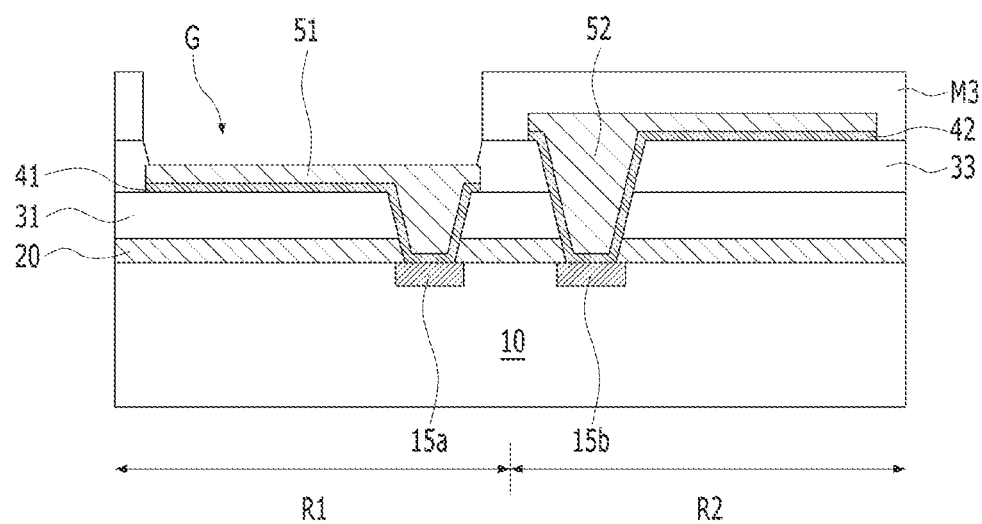

Referring to FIG. 6F, the method may further include forming a third mask pattern M3 and performing an etching process to selectively remove the upper dielectric layer 33 to form a groove G that exposes the first re-distribution pad 51.

Subsequently, the method may further include removing the third mask pattern M3 to form the semiconductor device, illustrated in FIGS. 1A to 1C.

According to the embodiments of the disclosure, because semiconductor devices have re-distribution pads that are disposed at different levels, chip wire bases may be sufficiently spaced apart from each other. In other words, the semiconductor device in accordance with the embodiments of the disclosure may prevent an electrical short between input/output signals and minimize interference.

While the disclosure has been described with respect to the specific embodiments, it will be apparent to those skilled in the art that various changes and modifications may be made without departing from the spirit and scope of the invention as defined in the following claims.

What is claimed is:

1. A semiconductor device, comprising:
a chip body having a first metal pad and a second metal pad adjacent to each other;
a passivation layer on the chip body;
a lower dielectric layer on the passivation layer;
a first re-distribution pad disposed on the lower dielectric layer;
an upper dielectric layer on the lower dielectric layer; and
a second re-distribution pad on the upper dielectric layer,
wherein an upper surface of the second re-distribution pad is positioned at a higher level than the upper surface of the first re-distribution pad,
wherein the first re-distribution pad is electrically connected to the first metal pad,
wherein the second re-distribution pad is electrically connected to the second metal pad,
wherein the first re-distribution pad and the second re-distribution pad are elongated in a first direction,
wherein the first re-distribution pad and the second re-distribution pad are adjacent to each other in a second direction, wherein the first direction and the second direction are perpendicular to each other,
wherein the first re-distribution pad is not electrically connected to the second re-distribution pad.

2. The semiconductor device of claim 1,
wherein the passivation layer exposes an upper surface of the first metal pad and an upper surface of the second metal pad.

3. The semiconductor device of claim 2, wherein the first re-distribution pad includes:
a first via portion penetrating the lower dielectric layer and the passivation layer to be coupled with the first metal pad;
a first extended portion disposed on the lower dielectric layer to extend from the first via portion in the first direction; and
a first pad portion corresponding to an end portion of the first extended portion,
wherein:
the first via portion is disposed near a center of the chip body, and
the first pad portion is disposed near an edge of the chip body.

4. The semiconductor device of claim 3, wherein the second re-distribution pad includes:
a second via portion penetrating the upper dielectric layer, the lower dielectric layer, and the passivation layer to be coupled with the second metal pad;
a second extended portion disposed on the upper dielectric layer to extend from the second via portion in the first direction; and
a second pad portion corresponding to an end portion of the second extended portion, and
wherein:
the second via portion is disposed near the center of the chip body, and
the second pad portion is disposed near the edge of the chip body.

5. The semiconductor device of claim 4, further comprising:
a first metal liner conformally formed on a lower surface of the first re-distribution pad; and
a second metal liner conformally formed on a lower surface of the second re-distribution pad.

6. The semiconductor device of claim 1, further comprising:
a protective dielectric layer that covers the first re-distribution pad and the second re-distribution pad,
wherein the protective dielectric layer includes a first connection hole that exposes a portion of the first re-distribution pad and includes a second connection hole that exposes a portion of the second re-distribution pad.

7. The semiconductor device of claim 6, further comprising:
a first pillar disposed in the first connection hole; and
a second pillar disposed in the second connection hole.

8. The semiconductor device of claim 7, wherein an upper end of the first pillar and an upper end of the second pillar are positioned at a same level.

9. A semiconductor device, comprising:
a chip body having a first metal pad and a second metal pad adjacent to each other;
a passivation layer on the chip body;
a lower dielectric layer on the passivation layer;
a first re-distribution pad on the lower dielectric layer;
an upper dielectric layer on the lower dielectric layer; and
a second re-distribution pad on the upper dielectric layer,
wherein the first re-distribution pad includes:
a first via portion vertically penetrating the lower dielectric layer and the passivation layer to be electrically connected to the first metal pad; and
a first extended portion extending from the first via portion in a first horizontal direction, and
wherein the second re-distribution pad includes:
a second via portion vertically penetrating the upper dielectric layer, the lower dielectric layer, and the passivation layer to be electrically connected to the second metal pad; and
a second extended portion extending from the second via portion in the first direction,
wherein the first re-distribution pad is not electrically connected to the second re-distribution pad.

10. A semiconductor device, comprising:
a lower dielectric layer disposed on a chip body;
a plurality of first re-distribution pads disposed on the lower dielectric layer;
an upper dielectric layer disposed on the lower dielectric layer; and
a plurality of second re-distribution pads disposed on the upper dielectric layer,
wherein:
the first re-distribution pads and the second re-distribution pads extend in parallel in a first direction,
the first re-distribution pads and the second re-distribution pads are alternately disposed in a second direction, the first direction and the second direction being perpendicular to each other, and
the first re-distribution pad is not electrically connected to the second re-distribution pad.

11. The semiconductor device of claim 10, wherein the second re-distribution pads are positioned at a higher level than the first re-distribution pads.

12. The semiconductor device of claim 10, wherein the chip body includes:
first metal pads disposed in a first region; and
second metal pads disposed in a second region, and
wherein each of the first re-distribution pads includes:
a first via portion penetrating the lower dielectric layer and the passivation layer to be coupled with the first metal pads; and
a first extended portion extending from the first via portion in the first direction, and wherein each of the second re-distribution pads includes:
a second via portion penetrating the upper dielectric layer, the lower dielectric layer, and the passivation layer to be coupled with the second metal pads; and
a second extended portion extending from the second via portion in the first direction.

13. The semiconductor device of claim 12, wherein:
the first re-distribution pads further include first pad portions corresponding to end portions of the first extended portions, respectively,
the second re-distribution pads further include second pad portions corresponding to end portions of the second extended portions, respectively, and
the first pad portions and the second pad portions are disposed near an edge of the chip body.

14. A method of manufacturing a semiconductor device, comprising:
preparing a chip body with a first metal pad and a second metal pad;
forming a passivation layer on the chip body;
forming a lower dielectric layer on the passivation layer;
forming a first re-distribution pad on the lower dielectric layer;
forming an upper dielectric layer on the lower dielectric layer; and
forming a second re-distribution pad on the upper dielectric layer,
wherein the first re-distribution pad is electrically connected to the first metal pad,
wherein the second re-distribution pad is electrically connected to the second metal pad,
wherein the first re-distribution pad and the second re-distribution pad are elongated in a first direction,
wherein the first re-distribution pad and the second re-distribution pad are adjacent to each other in a second direction, wherein the first direction and the second direction are perpendicular to each other,
wherein the first re-distribution pad is not electrically connected to the second re-distribution pad.

15. The method of claim 14, wherein forming the first re-distribution pad includes:
forming a lower hole that vertically penetrates the lower dielectric layer and the passivation layer to expose an upper surface of the first metal pad;
forming a lower metal liner on the upper surface of the first metal pad, an inner wall of the lower hole, and an upper surface of the lower dielectric layer;
forming a first mask pattern with a first trench on the lower metal liner; and
forming the first re-distribution pad on the lower metal liner that is exposed in the first trench.

16. The method of claim 15, wherein forming the second re-distribution pad includes:
forming an upper hole that exposes an upper surface of the second metal pad by vertically penetrating the upper dielectric layer, the lower dielectric layer, and the passivation layer;
forming an upper metal liner on the upper surface of the second metal pad, an inner wall of the upper hole, and an upper surface of the upper dielectric layer;
forming a second mask pattern with a second trench on the upper metal liner; and
forming the second re-distribution pad on the upper metal liner that is exposed in the second trench.

17. The method of claim 14, wherein the first re-distribution pad includes:
a first via portion penetrating the lower dielectric layer and the passivation layer to be coupled with the first metal pad;
a first extended portion extending from the first via portion in a horizontal direction; and
a first pad portion corresponding to an end portion of the first extended portion, and
wherein:
the first via portion is disposed near a center of the chip body, and
the first pad portion is disposed near an edge of the chip body.

18. The method of claim 17, wherein the second re-distribution pad includes:
a second via portion penetrating the upper dielectric layer, the lower dielectric layer, and the passivation layer to be coupled with the second metal pad;
a second extended portion extending from the second via portion in the horizontal direction; and
a second pad portion corresponding to an end portion of the second extended portion, and
wherein:
the second via portion is disposed near the center of the chip body, and
the second pad portion is disposed near the edge of the chip body.

19. The method of claim 14, further comprising:
forming a protective dielectric layer that covers the first re-distribution pad and the second re-distribution pad on the upper dielectric layer,
wherein the protective dielectric layer includes a first connection hole that exposes a portion of the first re-distribution pad and includes a second connection hole that exposes the second re-distribution pad.

20. The method of claim 19, further comprising:
forming a first metal pillar in the first connection hole; and
forming a second metal pillar in the second connection hole.

* * * * *